United States Patent
Chou et al.

(10) Patent No.: US 9,761,683 B2
(45) Date of Patent: Sep. 12, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chun-Yuan Chou, Taipei (TW); Chung-Chiang Wu, Taipei (TW); Da-Yuan Lee, Hsinchu County (TW); Weng Chang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/714,221

(22) Filed: May 15, 2015

(65) Prior Publication Data
US 2016/0336420 A1 Nov. 17, 2016

(51) Int. Cl.
*H01L 29/78* (2006.01)
*H01L 29/49* (2006.01)
(Continued)

(52) U.S. Cl.
CPC ...... *H01L 29/495* (2013.01); *H01L 21/28079* (2013.01); *H01L 21/28088* (2013.01);
(Continued)

(58) Field of Classification Search
CPC ......... H01L 29/66795; H01L 29/66545; H01L 29/66515; H01L 29/6656; H01L 29/66553;
(Continued)

(56) References Cited

U.S. PATENT DOCUMENTS

| 7,667,271 B2 | 2/2010 | Yu et al. |
| 7,910,453 B2 | 3/2011 | Xu et al. |

(Continued)

FOREIGN PATENT DOCUMENTS

JP   2007-324593 A   12/2007

OTHER PUBLICATIONS

Office Action Korean Patent Application No. 10-2015-0166569 dated Dec. 11, 2016.

*Primary Examiner* — Matthew Landau
*Assistant Examiner* — Scott Stowe
(74) *Attorney, Agent, or Firm* — McDermott Will & Emery LLP

(57) ABSTRACT

A method of manufacturing a Fin FET includes forming a fin structure including an upper layer. Part of the upper layer is exposed from an isolation insulating layer. A dummy gate structure is formed over part of the fin structure. The dummy gate structure includes a dummy gate electrode layer and a dummy gate dielectric layer. An interlayer insulating layer is formed over the dummy gate structure. The dummy gate structure is removed so that a space is formed. A gate dielectric layer is formed in the space. A first metal layer is formed over the gate dielectric in the space. A second metal layer is formed over the first metal layer in the space. The first and second metal layers are partially removed, thereby reducing a height of the first and second metal layers. A third metal layer is formed over the partially removed first and second metal layers.

21 Claims, 11 Drawing Sheets

(51) Int. Cl.
   *H01L 29/66* (2006.01)
   *H01L 21/28* (2006.01)
   *H01L 29/06* (2006.01)
   H01L 21/285 (2006.01)
   H01L 21/768 (2006.01)

(52) U.S. Cl.
   CPC ...... *H01L 29/0649* (2013.01); *H01L 29/4966* (2013.01); *H01L 29/66545* (2013.01); *H01L 29/66795* (2013.01); *H01L 29/785* (2013.01); H01L 21/28562 (2013.01); H01L 21/76877 (2013.01); H01L 21/76879 (2013.01)

(58) Field of Classification Search
   CPC ............... H01L 29/495; H01L 29/4958; H01L 29/4966; H01L 27/088; H01L 27/0886; H01L 27/092; H01L 27/0922; H01L 27/0924
   See application file for complete search history.

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2007/0272967 A1 | 11/2007 | Pantisano et al. |
| 2012/0139061 A1* | 6/2012 | Ramachandran . H01L 21/76895 257/410 |
| 2014/0001574 A1 | 1/2014 | Chen et al. |
| 2014/0110755 A1 | 4/2014 | Colinge |
| 2014/0151812 A1 | 6/2014 | Liaw |
| 2015/0061027 A1* | 3/2015 | Hong .................... H01L 27/092 257/369 |
| 2015/0118836 A1* | 4/2015 | Lin .................... H01L 29/66583 438/586 |

* cited by examiner

SEMICONDUCTOR DEVICE AND MANUFACTURING METHOD THEREOF

TECHNICAL FIELD

The disclosure relates to a semiconductor integrated circuit, more particularly to a semiconductor device having a metal gate structure and its manufacturing process.

BACKGROUND

As the semiconductor industry has progressed into nanometer technology process nodes in pursuit of higher device density, higher performance, and lower costs, challenges from both fabrication and design issues have resulted in the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
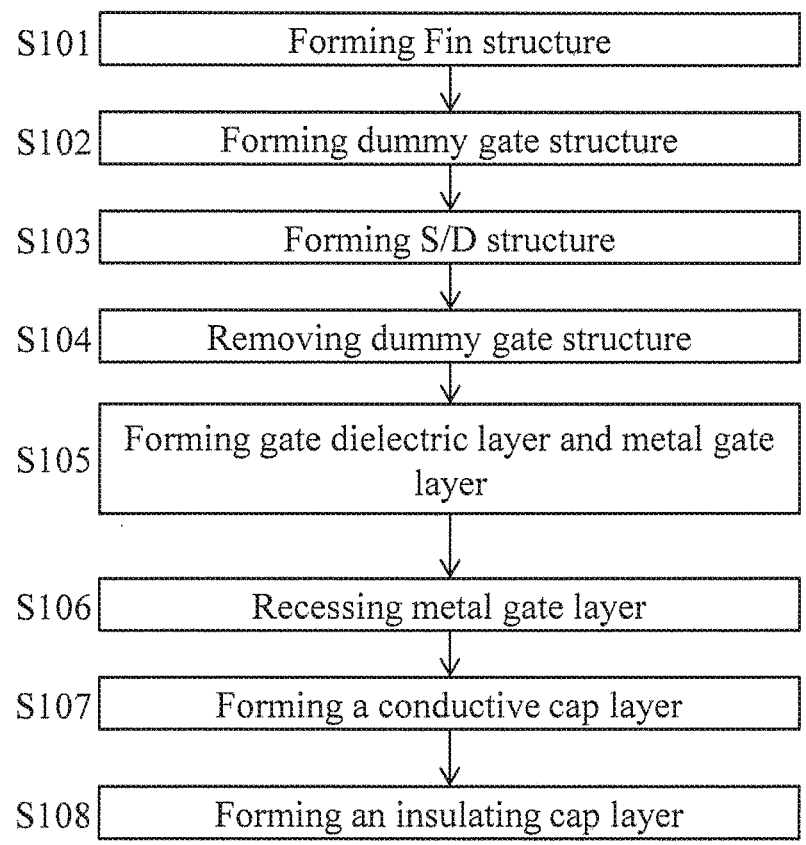
FIG. 1 is an exemplary flow chart for manufacturing a semiconductor FET device according to one embodiment of the present disclosure.

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after processes shown by FIG. 1, and some of the operations described below can be replaced or eliminated for additional embodiments of the method. The order of the operations/processes may be interchangeable.

Figure 2A:
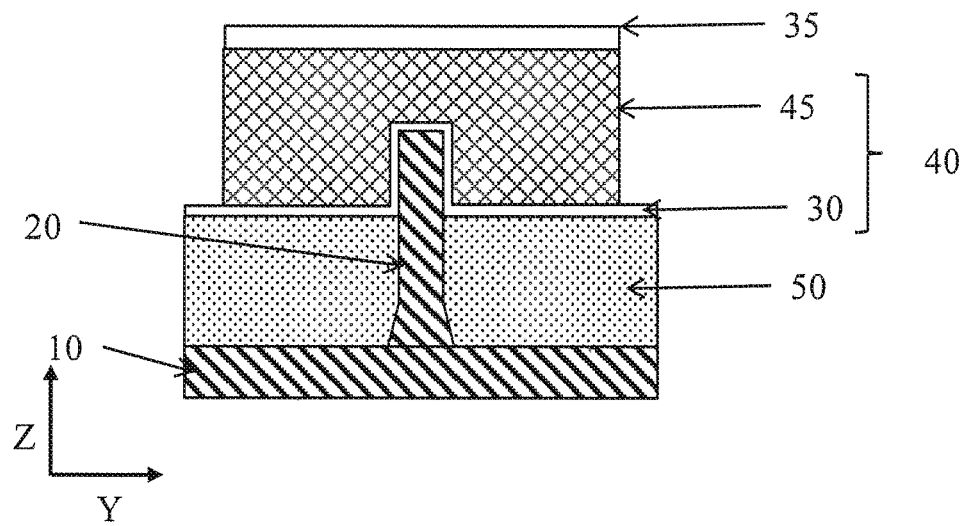
FIGS. 2A-11B show exemplary views of various stages for manufacturing a semiconductor FET device according to one embodiment of the present disclosure.
Figure 2B:
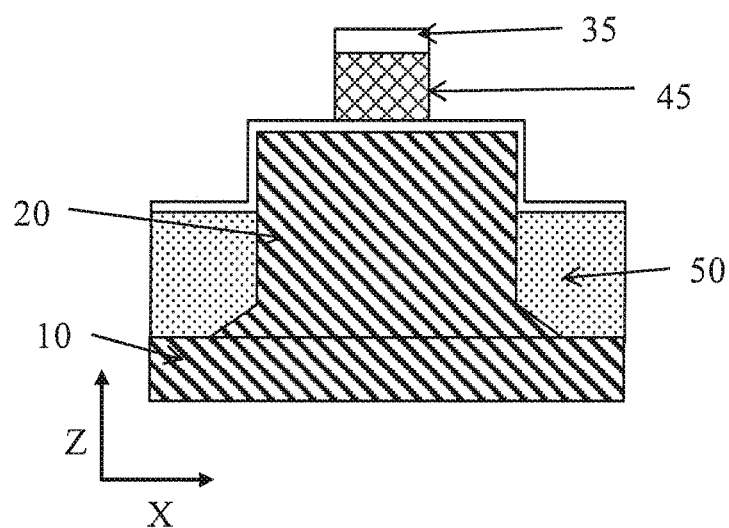
Figure 2C:
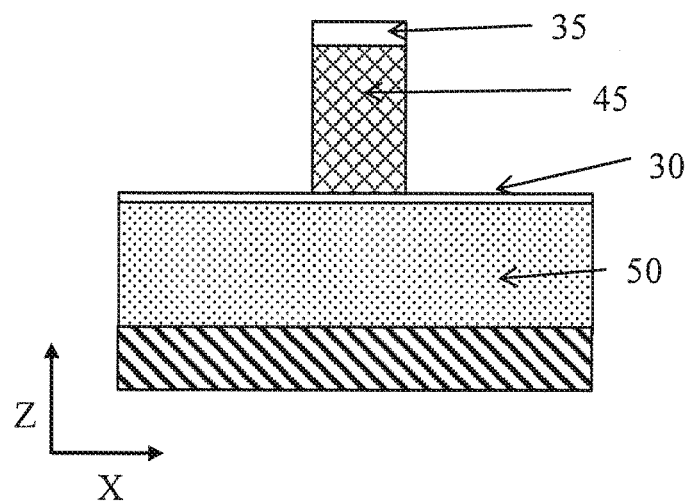
Figure 2D:
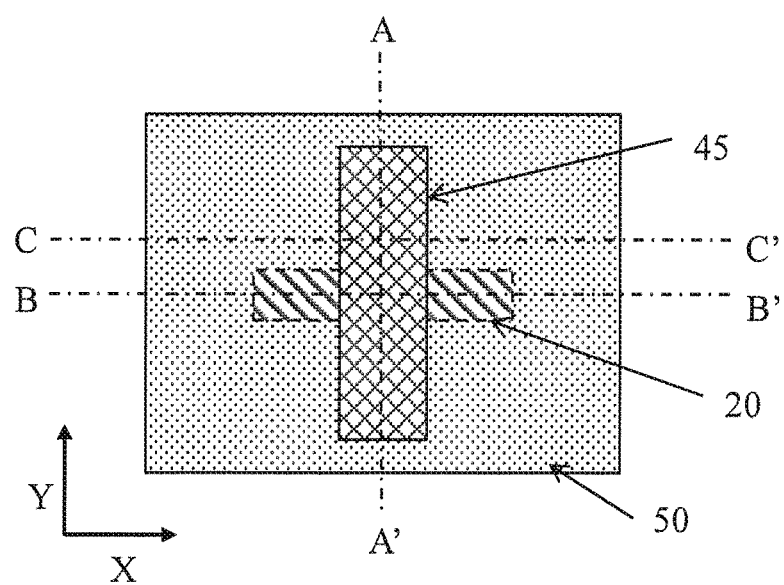

FIGS. 2A-2C are exemplary cross sectional views of the Fin FET device at one of the various stages of the fabrication process according to one embodiment. FIG. 2D is a planar view, FIG. 2A is a cross sectional view along the line A-A' of FIG. 2D, FIG. 2B is a cross sectional view along the line B-B' of FIG. 2D and FIG. 2C is a cross sectional view along the line C-C' of FIG. 2D.

In S101 of FIG. 1, a fin structure 20 is fabricated over a substrate 10. The fin structure 20 is formed over a substrate 10 and protrudes from an isolation insulating layer 50. The portion of the fin structure 20 protruding from the isolation insulating layer 50 functions as a channel layer.

To fabricate a fin structure according to one embodiment, a mask layer is formed over a substrate 10. The mask layer is formed by, for example, a thermal oxidation process and/or a chemical vapor deposition (CVD) process. The substrate 10 is, for example, a p-type silicon substrate with an impurity concentration in a range of about $1\times10^{15}$ cm$^{-3}$ to about $2\times10^{15}$ cm$^{-3}$. In other embodiments, the substrate 10 is an n-type silicon substrate with an impurity concentration in a range of about $1\times10^{15}$ cm$^{-3}$ to about $2\times10^{15}$ cm$^{-3}$. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the substrate is patterned into a fin structure 20 by trench etching using a dry etching method and/or a wet etching method. A height of the fin structure 20 is in a range of about 20 nm to about 300 nm. In certain embodiments, the height is in a range of about 30 nm to about 60 nm. When the heights of the fin structures are not uniform, the height from the substrate may be measured from the plane that corresponds to the average heights of the fin structures. The width of the fin structure 20 is in a range of about 7 nm to about 15 nm.

In this embodiment, a bulk silicon wafer is used as the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

As shown in FIGS. 2A-2D, one fin structure 20 extending in the X direction is disposed over the substrate 10. However, the number of the fin structure is not limited to one. The numbers may be two, three, four or five or more. In addition, one or more dummy fin structures may be disposed adjacent to both sides of the fin structure 20 to improve pattern fidelity in the patterning processes. The width of the fin structure 20 is in a range of about 5 nm to about 40 nm in some embodiments, and may be in a range of about 7 nm to about 15 nm in certain embodiments. When multiple fin structures are disposed, the space between the fin structures is in a range of about 5 nm to about 80 nm in some embodiments, and may be in a range of about 7 nm to about 15 nm in other embodiments. One skilled in the art will realize, however, that the dimensions and values recited throughout the descriptions are merely examples, and may be changed to suit different scales of integrated circuits.

In this embodiment, the Fin FET device is a p-type Fin FET. However, the technologies disclosed herein are also applicable to an n-type Fin FET.

After forming the fin structure 20, an isolation insulating layer 50 is formed over the fin structure 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50 over the fin structure 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the channel layer (upper layer) of the fin structure 20 is exposed.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

In S102 of FIG. 1, a dummy gate structure 40 is formed over part of the fin structure 20 as shown in FIGS. 2A-2D.

A dielectric layer and a poly silicon layer are formed over the isolation insulating layer 50 and the exposed fin structure, and then patterning operations are performed so as to obtain a dummy gate structure 40 including a dummy gate electrode layer 45 made of poly silicon and a dummy gate dielectric layer 30. The patterning of the poly silicon layer is performed by using a hard mask 35 including a silicon nitride layer formed over a silicon oxide layer in some embodiments. In other embodiments, the hard mask may include a silicon oxide layer formed over a silicon nitride layer. The dummy gate dielectric layer 30 may be silicon oxide formed by CVD, PVD, ALD, e-beam evaporation, or other suitable process. In some embodiments, the dummy gate dielectric layer 30 may include one or more layers of silicon oxide, silicon nitride, silicon oxy-nitride, or high-k dielectrics. In some embodiments, a thickness of the gate dielectric layer is in a range of about 5 nm to about 20 nm, and in a range of about 5 nm to about 10 nm in other embodiments.

In some embodiments, the dummy gate electrode layer 45 may comprise a single layer or multilayer structure. The dummy gate electrode layer 45 may be doped poly silicon with uniform or non-uniform doping. The dummy gate electrode layer 45 may be formed using a suitable process such as ALD, CVD, PVD, plating, or combinations thereof. In the present embodiment, the width of the dummy gate electrode layer 45 is in the range of about 30 nm to about 60 nm. In some embodiments, a thickness of the gate electrode layer is in a range of about 20 nm to about 400 nm, and may be in a range of about 50 nm to 150 nm.

Figure 3A:
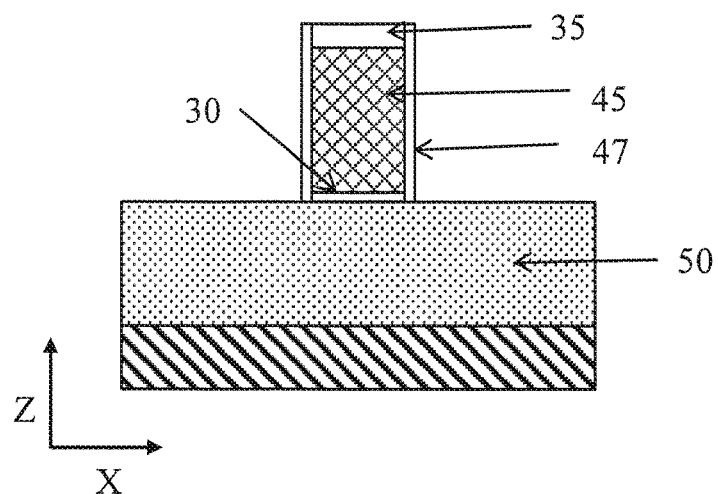

As shown in FIG. 3, side-wall insulating layers 47 are formed over both main sides of the dummy gate electrode 45. FIG. 3A is an exemplary cross sectional view corresponding to line C-C' of FIG. 2D at one of the various stages of the fabrication process according to one embodiment.

The side-wall insulating layers 47 may include silicon oxide, silicon nitride, silicon oxy-nitride, or other suitable material. The side-wall insulating layers 47 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range of about 5 nm to about 30 nm in some embodiments, and in a range of about 10 nm to about 20 nm in other embodiments.

Figure 3B:
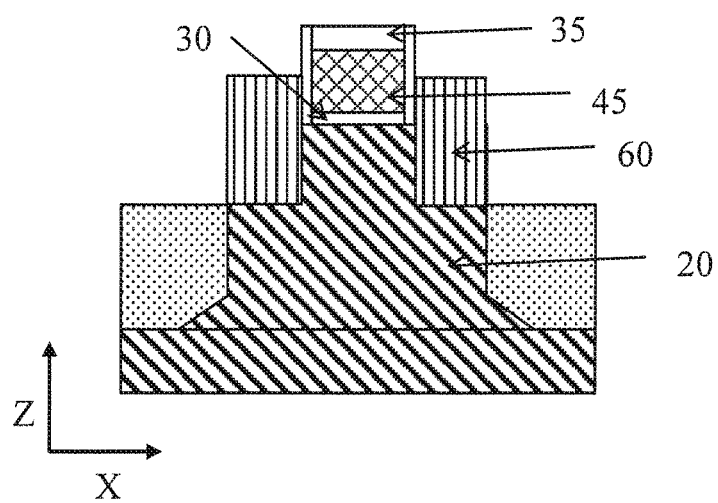

In S103 of FIG. 1, a source and a drain 60 are formed as shown in FIG. 3B. FIG. 3B is an exemplary cross sectional view corresponding to line B-B' of FIG. 2D at one of the various stages of the fabrication process according to one embodiment. The source and drain 60 may include a strain layer to apply stress to the channel layer. In some embodiments, the portion of the upper layer of the fin structure 20 not covered by the dummy gate structure 40 are etched down to form a recessed portions. Then, an appropriate strain layer is formed in the recessed portions. In some embodiments, the strain layer includes a single layer or multiple layers including SiGe for a p-type FET and SiP, SiC or SiCP for an n-type FET. The strain layer is epitaxially formed in the recessed portions.

Figure 4:
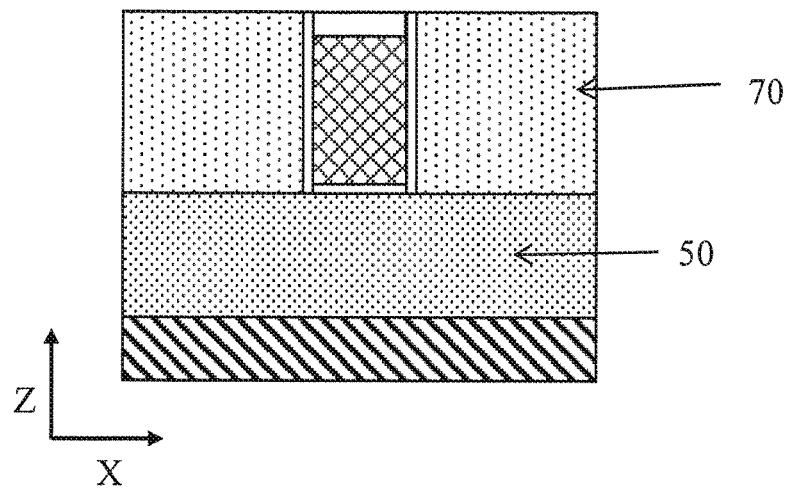

As shown in FIG. 4, an interlayer dielectric (ILD) layer 70 is formed over the dummy gate structure 40 with the side wall insulating layers 47.

A dielectric material is formed over the dummy gate structure and the isolation insulating layer 50, and planarization operations, such as an etch back process and/or a chemical mechanical polishing (CMP) process, are performed, so as to obtain the structure shown in FIG. 4. The dielectric material for the interlayer dielectric layer 70 may include one or more layers of silicon oxide, silicon nitride, silicon oxynitride (SiON), SiOCN, fluoride-doped silicate glass (FSG), or a low-K dielectric material. The insulating material for the interlayer dielectric layer 70 may be the same as or different from that for the isolation insulating layer 50.

Figure 5:
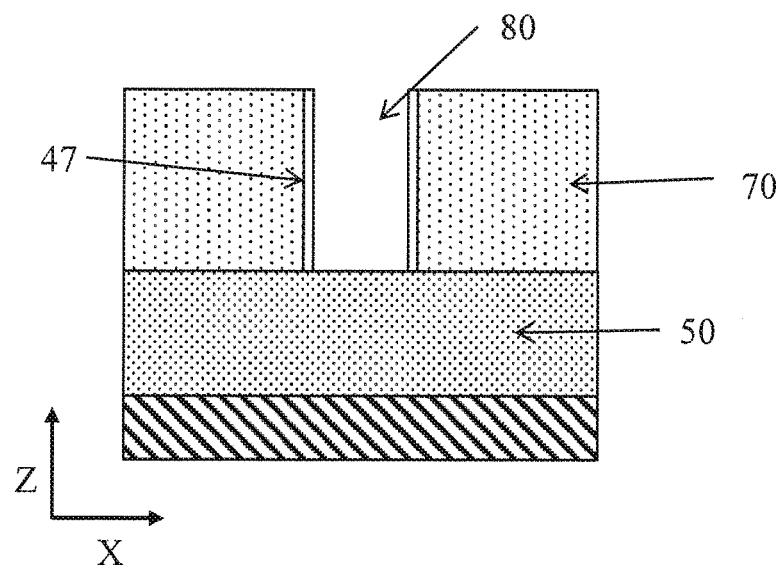

In S104 of FIG. 1, after the interlayer dielectric layer 70 is formed, as shown in FIG. 5, the dummy gate structure 40 is removed by dry etching and/or wet etching, so that a space 80 is formed. The depth of the space 80 is in a range of about 50 nm to about 400 nm, and may be in a range of about 100 nm to 200 nm. An aspect ratio of the space 80 may be in a range of 0.5 to 20 in some embodiments.

Figure 6:
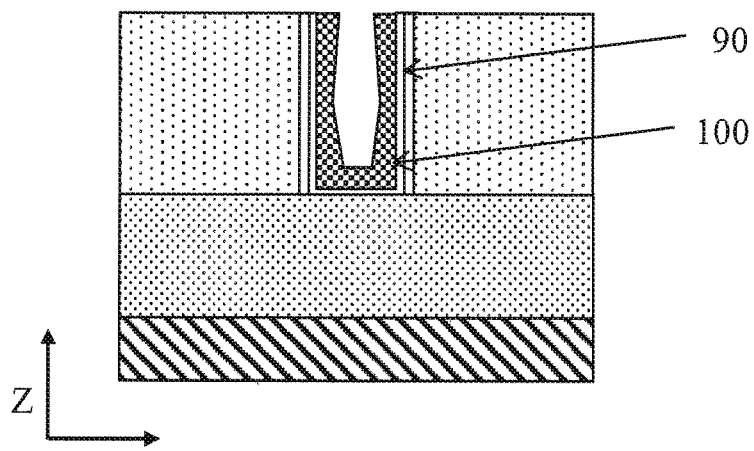

In S105 of FIG. 1, a gate dielectric layer 90 and a metal gate layer 100 are formed in the space 80, as shown in FIG. 6. A gate dielectric layer 90 is formed over an interface layer (not shown) disposed over the channel layer of the fin structure 20. The interface layer may include silicon oxide with a thickness of 0.2 nm to 1.5 nm in some embodiments. The silicon oxide interface layer may be formed by oxidizing the Si channel layer. In other embodiments, the thickness of the interface layer is in a range about 0.5 nm to about 1.0 nm.

The gate dielectric layer 90 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 90 is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer 90 is in a range of about 1 nm to about 10 nm in some embodiments, and may be in a range of about 2 nm to about 7 nm in other embodiments. In some embodiments, the gate dielectric layer 90 may include an interfacial layer made of silicon dioxide.

A gate electrode 100 is formed over the gate dielectric layer 90, as shown in FIG. 6. The gate electrode 100 includes one or more layers of any suitable metal materials, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer 90 and the gate electrode 100. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the p-type Fin FET, one or more of TiAlC, Al, TiAl, TaN, TaAlC, TiN, TiC and Co may be used as the work function adjustment layer.

As shown in FIG. 6, the metal material of the gate electrode 100 does not fully fill the space 80.

Figure 7:
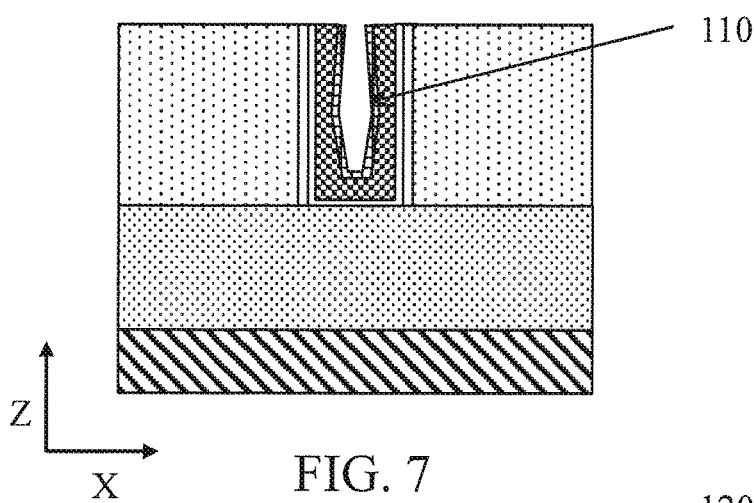

As shown in FIG. 7, a thin metal layer 110 is formed over the gate electrode 100. In one embodiment, the thin metal layer 110 includes tungsten (W) formed by, for example, ALD using $WCl_5$ and $H_2$ as source gases. Generally, tungsten by ALD is selectively formed over a conductive surface and is not formed over an insulating surface. The thickness of the tungsten thin metal layer 110 is in a range of about 0.5 nm to about 7 nm in some embodiments, and in a range of about 1 nm to about 5 nm in other embodiments.

Figure 8:
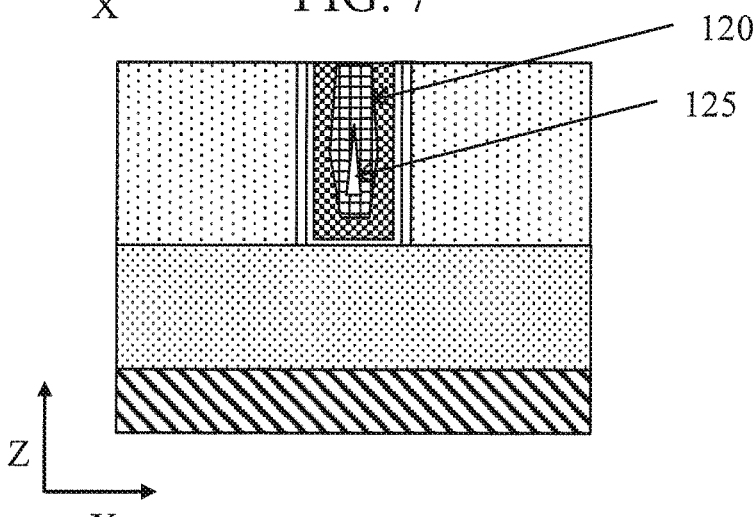

As shown in FIG. 8, a fill-in metal layer 120 is formed. The fill-in metal layer 120 is formed over the thin metal layer 110. In one embodiment, the fill-in metal layer 120 includes tungsten (W) formed by, for example, CVD. After the CVD of tungsten, a seam or a void 125 may be formed because of a high aspect ratio of the space 80. In some embodiments, a planarization operation such as a CMP may be performed to remove tungsten formed over the interlayer dielectric layer 70.

Figure 9:
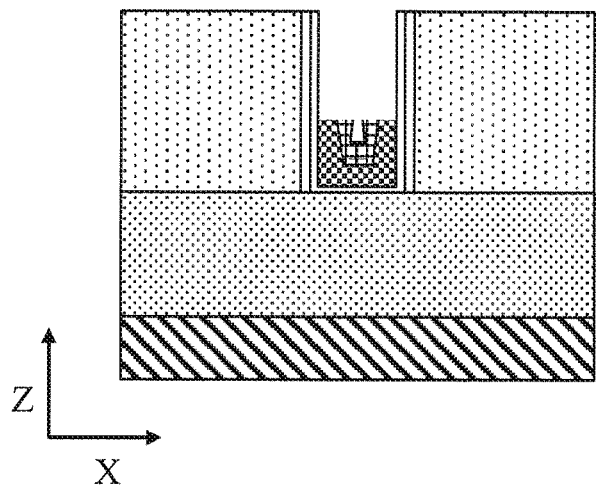

In S106 of FIG. 1, the metal gate structure formed in the space 80 is partially removed (recessed), as shown in FIG. 9. The metal gate structure including the metal gate electrode 100 and tungsten layers 110 and 120 is etched back to reduce its height by using fluorine containing gas (e.g., $NF_3$) and/or chlorine containing gas (e.g., $BCl_3$).

Figure 10:
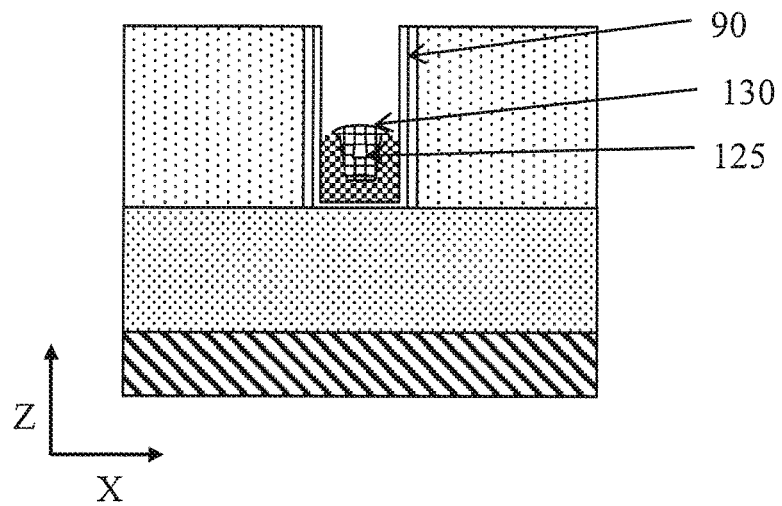

In S107 of FIG. 1, a conductive cap layer is formed over the recessed metal gate structure. As shown in FIG. 10, a conductive cap layer 130 is formed over the recessed metal gate structure. In one embodiment, the conductive cap layer includes tungsten formed by ALD using $WCl_5$ and $H_2$ as source gases. Generally, tungsten by ALD is selectively formed over a conductive surface and is not formed over an insulating surface. Accordingly, tungsten is formed only over the etched metal gate structure and is substantially not formed on the gate dielectric layer 90 disposed on side walls of the space 80. The thickness of the tungsten cap layer 130 is in a range of about 0.5 nm to about 15 nm in some embodiments, and may be in a range of about 1 nm to about 10 nm in some embodiments. The conductive cap layer 130 may partially or fully fill the void 125.

In other embodiments, the layers 110, 120 and/or 130 may be made of a compound of tungsten such as tungsten nitride, or one or more of other refractory metals and a compound thereof. For example, Ta, Ti and/or nitride thereof may be used as the layers 110, 120 and/or 130.

In the etch-back operation of the metal gate structure of S106, pits may be formed on the etched surface of the tungsten layer, which will cause higher gate resistance. Since tungsten is further formed over the etched metal gate structure, the pits are filled by tungsten, thereby reducing gate resistance.

Figure 11A:
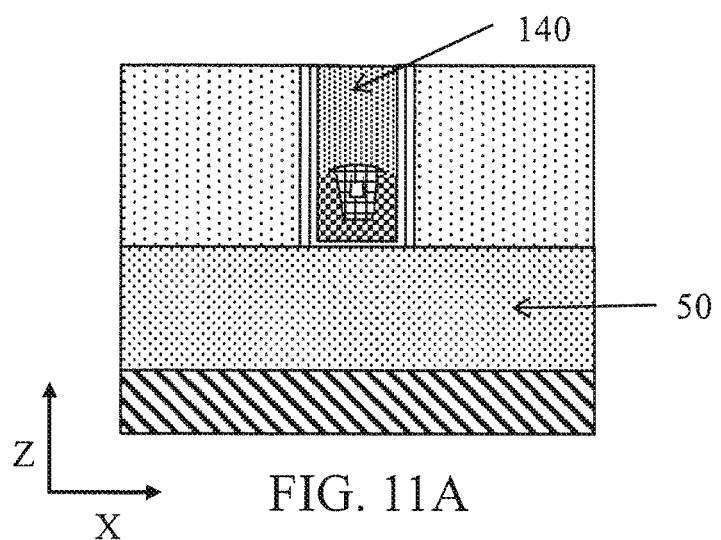
Figure 11B:
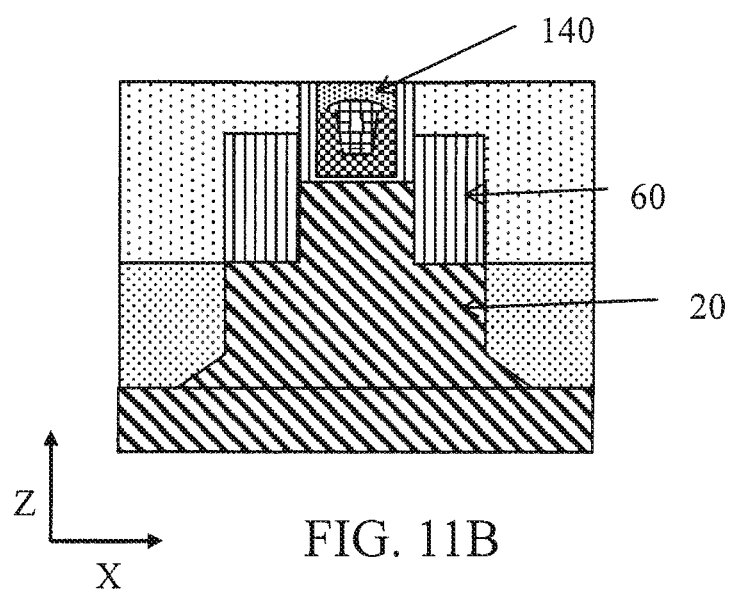

In S108 of FIG. 1, an insulating cap layer 140 is formed over the metal gate structure, as shown in FIGS. 11A and 11B. FIG. 11A is an exemplary cross sectional view corresponding to line C-C' of FIG. 2D, and FIG. 11B is an exemplary cross sectional view corresponding to line B-B' of FIG. 2D at one of the various stages of the fabrication process according to one embodiment. The insulating cap layer 140, for example, a silicon nitride layer, is formed over the metal gate structure in the space 80. The silicon nitride cap layer 140 may be formed by CVD or ALD. A planarization operation such as CMP may be performed after the deposition of silicon nitride.

It is understood that the device shown in FIGS. 11A and 11B may undergo further CMOS processes to form various features such as contacts/vias, interconnect metal layers, dielectric layers, passivation layers, etc.

FIGS. 12A-16 show exemplary views of various stages for manufacturing a semiconductor FET device according to another embodiment of the present disclosure. In this embodiment, the semiconductor FET device is a planar type FET. Materials, operations, and/or dimensions described with respect to the above embodiments (FIGS. 1-11B) are generally applicable to the following embodiment where appropriate, and explanations thereof may be omitted.

Figure 12A:
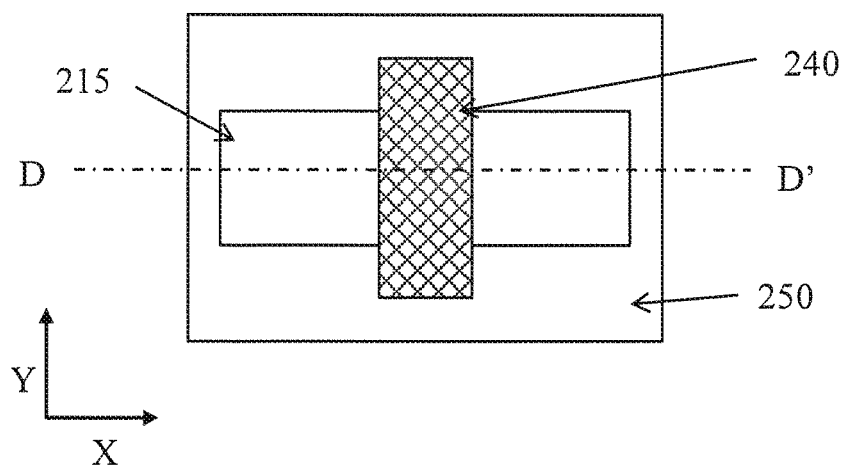
FIGS. 12A-16 show exemplary views of various stages for manufacturing a semiconductor FET device according to another embodiment of the present disclosure.
Figure 12B:
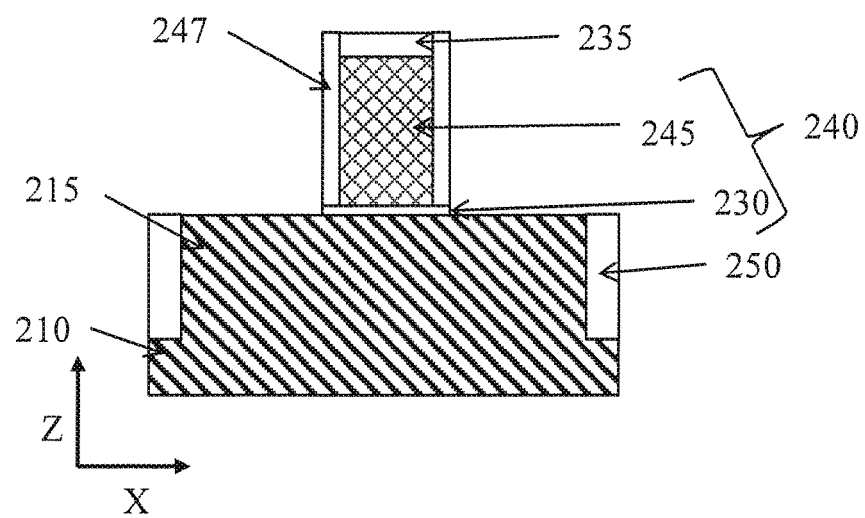

FIG. 12A is an exemplary planar view of a semiconductor FET device and FIG. 12B is an exemplary cross sectional view of the semiconductor FET device along the D-D' line of FIG. 12A, at one of various stages of the fabrication process according to one embodiment.

FIGS. 12A and 12B show a structure after a dummy gate structure 240 is formed over a substrate 210. The substrate 210 includes a region 215 that is to be a source and drain, and a shallow trench isolation (STI) region 250 surrounds the region 215 in a planar view.

The dummy gate structure includes a dummy gate electrode 245 and a dummy gate dielectric layer 230. Similar to the embodiment as set forth above, a dielectric layer and a poly silicon layer are formed over the substrate 10, and then patterning operations are performed so as to obtain the dummy gate structure 240. The dummy gate electrode layer 245 is made of poly silicon in some embodiments. The patterning of the poly silicon layer is performed by using a hard mask 235 including a silicon nitride layer formed over a silicon oxide layer in some embodiments. In other embodiments, the hard mask may include a silicon oxide layer formed over a silicon nitride layer. The dummy gate dielectric layer 230 may be silicon oxide.

Similar to the embodiment as set forth above, side-wall insulating layers 247 are formed over both main sides of the dummy gate electrode 245. The side-wall insulating layers 247 may include silicon oxide, silicon nitride, silicon oxynitride, or other suitable materials.

Figure 13:
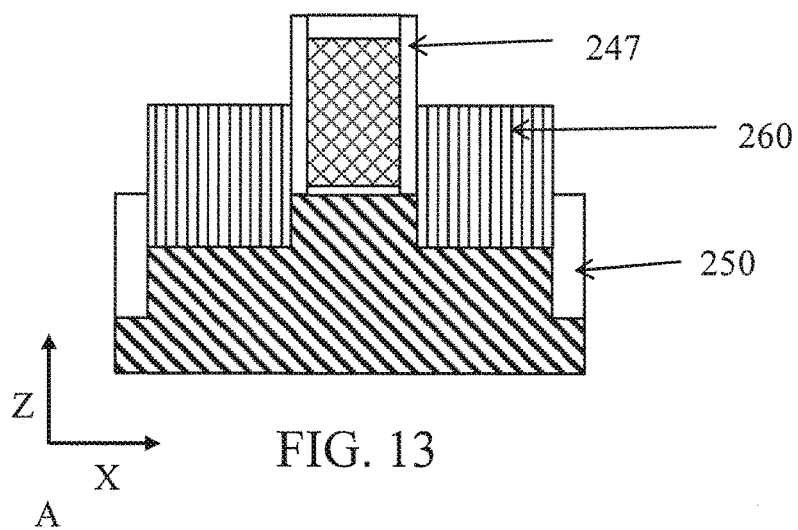

FIG. 13 is an exemplary cross sectional view of the semiconductor FET device corresponding to the D-D' line of FIG. 12A at one of various stages of the fabrication process according to one embodiment. As shown in FIG. 13, a source and a drain 260 are formed. In one embodiment of the present disclosure, a raised source/drain structure is employed. The region 215 of the substrate 210 is recessed by etching operations including dry etching and/or wet etching. In case of the wet etching, TMAH (tetramethylammonium hydroxide), KOH or other suitable etchants are used.

Then, a strain material is formed in the recess. In some embodiments, the strain material includes a single layer or multiple layers including SiGe for a p-type FET and SiP, SiC or SiCP for an n-type FET. In certain embodiments, the strain material is epitaxially formed in the recess.

Figure 14:
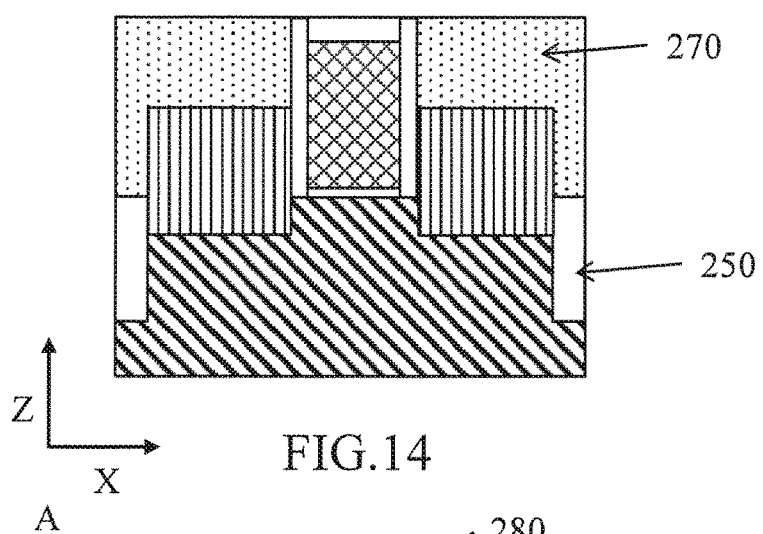

As shown in FIG. 14, an interlayer dielectric layer 270 is formed over the dummy gate structure 240, the source and drain 260 and the substrate 210. A dielectric material formed over the dummy gate structure 240, the source and drain 260 and the substrate 210, and planarization operations, such as an etch back process and/or a chemical mechanical polishing (CMP) process, are performed, so as to obtain the structure shown in FIG. 14.

Figure 15:
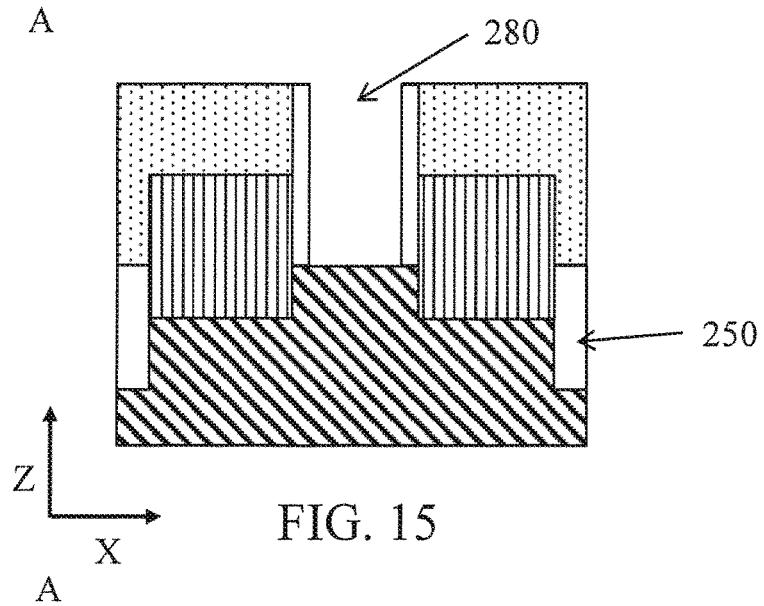

After the interlayer dielectric lay 270 is formed, the dummy gate structure 240 is removed by dry etching and/or wet etching, so that a space 280 is formed, as show in FIG. 15. The depth of the space 280 is in a range of about 50 nm to about 400 nm, and may be in a range of about 100 nm to 200 nm. An aspect ratio of the space 280 may be in a range of 0.5 to 20 in some embodiments.

Figure 16:
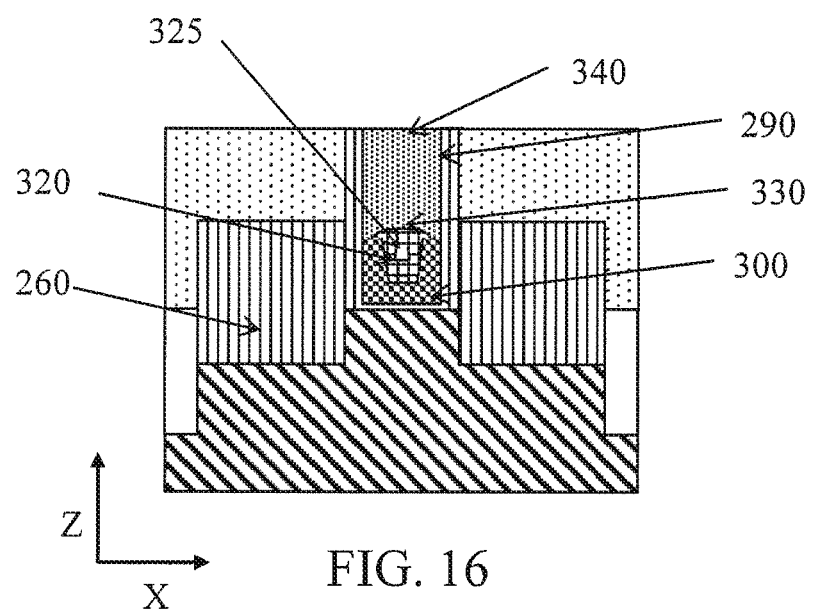

After the space 280 is formed, the operations similar to those described with FIGS. 6-11B are performed, and the structure shown in FIG. 16 is obtained. Similar to FIGS. 11A and 11B, the metal gate structure includes a high-k gate dielectric layer 290, a metal gate electrode 300, a fill-in metal layer 320 made of tungsten, a conductive cap layer 330 made of tungsten and an insulating cap layer 340 made of silicon nitride.

It is understood that the structure shown in FIG. 16 may undergo further CMOS processes to form various features such as contacts/vias, interconnect metal layers, dielectric layers, passivation layers, etc.

In the present disclosure, a conductive cap layer made of, for example, tungsten, is formed after the metal gate structure is recessed. By deposition of the conductive cap layer, pits formed in the recess etching operations can be filled, thereby reducing a gate resistance.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a fin structure is formed over a substrate. The fin structure extends in a first direction and includes an upper layer. Part of the upper layer is exposed from an isolation insulating layer. A dummy gate structure is formed over part of the fin structure. The dummy gate structure includes a dummy gate electrode layer and a dummy gate dielectric layer. The dummy gate structure extends in a second direction perpendicular to the first direction. An interlayer insulating layer is formed over the dummy gate structure, the fin structure and the isolation insulating layer. The dummy gate structure is removed so that a space corresponding to the dummy gate structure is formed. A gate dielectric layer is formed in the space. A first metal layer is formed over the gate dielectric in the space. A second metal layer is formed over the first metal layer in the space. The first and second metal layers are partially removed, thereby reducing a height of the first and second metal layers in the space. A third metal layer is formed over the partially removed first and second metal layers.

In accordance with another aspect of the present disclosure, in a method of manufacturing a semiconductor device, a dummy gate structure is formed over a substrate. An interlayer insulating layer is formed over the dummy gate structure and the substrate. The dummy gate structure is removed so that a space corresponding to the dummy gate structure is formed. A gate dielectric layer is formed in the space. A first metal layer is formed over the gate dielectric in the space. A second metal layer is formed over the first metal layer in the space. The first and second metal layers are partially removed, thereby reducing a height of the first and second metal layers in the space. A third metal layer is formed over the partially removed first and second metal layers.

In accordance with another aspect of the present disclosure, a semiconductor device includes a Fin FET. The FET includes a metal gate structure, which includes a gate dielectric layer; a first metal layer disposed over the gate dielectric layer; a second metal layer disposed over the first metal layer; and a third metal layer disposed over the first and second metal layers. The second metal layer forms a seam or a void, and the third metal layer partially fills the seam or the void.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a fin field effect transistor (FinFET), the method comprising:
    forming a fin structure over a substrate, the fin structure extending in a first direction and including an upper layer, part of the upper layer being exposed from an isolation insulating layer;
    forming a dummy gate structure over part of the fin structure, the dummy gate structure including a dummy gate electrode layer and a dummy gate dielectric layer, the dummy gate structure extending in a second direction perpendicular to the first direction;
    forming an interlayer insulating layer over the dummy gate structure, the fin structure and the isolation insulating layer;
    removing the dummy gate structure so that a space corresponding to the dummy gate structure is formed;
    forming a gate dielectric layer in the space;
    forming a first metal layer over the gate dielectric in the space;
    forming a second metal layer over the first metal layer in the space;
    partially removing the first and second metal layers, thereby reducing a height of the first and second metal layers in the space; and
    forming a third metal layer over the partially removed first and second metal layers, wherein:
        after reducing the height of the first and second metal layers, a part of the gate dielectric layer is exposed in the spaced, and
        the third metal layer is selectively formed over the partially removed first and second metal layers by atomic layer deposition such that the third metal layer is not formed on the exposed gate dielectric layer.

2. The method of claim 1, wherein the second metal layer includes one of more of refractory metals and a compound thereof.

3. The method of claim 2, wherein the forming the second metal layer includes:
    forming a first layer over the first metal layer by atomic layer deposition; and
    forming a second layer over the first layer by chemical vapor deposition.

4. The method of claim 2 wherein the third metal layer includes one or more of refractory metals and a compound thereof.

5. The method of claim 1, wherein after forming the second metal layer, a seam or a void is formed in the space.

6. The method of claim 5, wherein part of the seam or void is filled by the third metal layer.

7. The method of claim 1, wherein a thickness of the third metal layer is in a range of 0.5 nm to 15 nm.

8. The method of claim 1, further comprising forming an insulating cap layer over the third metal layer.

9. The method of claim 1, wherein the third metal layer is formed such that a height of the third metal layer as deposited does not exceed a height of the interlayer insulating layer.

10. A method of manufacturing a semiconductor device, the method comprising:
    forming a dummy gate structure over a substrate;
    forming an interlayer insulating layer over the dummy gate structure and the substrate;
    removing the dummy gate structure so that a space corresponding to the dummy gate structure is formed;
    forming a gate dielectric layer in the space;
    forming a first metal layer over the gate dielectric in the space;
    forming a second metal layer over the first metal layer in the space;
    partially removing the first and second metal layers, thereby reducing a height of the first and second metal layers in the space; and
    forming a third metal layer over the partially removed first and second metal layers, wherein:
        the second metal layer includes one or more of refractory metals and a compound thereof, and
        the forming the second metal layer includes:
            forming a first layer over the first metal layer by atomic layer deposition; and
            forming a second layer over the first layer by chemical vapor deposition.

11. The method of claim 10, wherein the third metal layer includes one or more of refractory metals and a compound thereof.

12. The method of claim 11, wherein the third metal layer is selectively formed over the partially removed first and second metal layers by atomic layer deposition.

13. The method of claim 10, wherein after forming the second metal layer, a seam or a void is formed in the space.

14. The method of claim 13, wherein part of the seam or void is filled by the third metal layer.

15. The method of claim 10, wherein a thickness of the third metal layer is in a range of 0.5 nm to 15 nm.

16. The method of claim 10, further comprising forming an insulating cap layer over the third metal layer.

17. The method of claim 10, wherein the third metal layer is formed such that a height of the third metal layer as deposited does not exceed a height of the interlayer insulating layer.

18. The method of claim 10, wherein:
after reducing the height of the first and second metal layers, a part of the gate dielectric layer is exposed in the spaced, and
the third metal layer is selectively formed over the partially removed first and second metal layers by atomic layer deposition such that the third metal layer is not formed on the exposed gate dielectric layer.

19. A semiconductor device, comprising a field effect transistor (FET), wherein:
the FET includes a metal gate structure,
the metal gate structure includes:
sidewall spacers forming a gate space;
a gate dielectric layer formed in the gate space;
a first metal layer disposed over the gate dielectric layer and formed in the gate space;
a second metal layer disposed over the first metal layer and formed in the gate space; and
a third metal layer disposed over the first and second metal layers and formed in the gate space,
the third metal layer has no direct contact with the sidewall spacers,
a seam or a void is formed by the second metal layer and the third metal layer, and
the third metal layer is in direct contact with the first and second metal layers.

20. The semiconductor device of claim 19, wherein the second and third metal layer include one or more of refractory metals and a compound thereof.

21. The semiconductor device of claim 19, wherein the third metal layer has no direct contact with the gate dielectric layer.

* * * * *